United States Patent
Kim

(10) Patent No.: US 10,269,428 B2
(45) Date of Patent: *Apr. 23, 2019

(54) NANO STRUCTURES, DEVICE USING THE SAME, AND METHOD FOR FABRICATING THE NANO STRUCTURES

(71) Applicant: SK INNOVATION CO., LTD., Seoul (KR)

(72) Inventor: Jun-Hyung Kim, Daejeon (KR)

(73) Assignee: SK INNOVATION CO., LTD., Seoul (KR)

( * ) Notice: Subject to any disclaimer, the term of this patent is extended or adjusted under 35 U.S.C. 154(b) by 236 days.

This patent is subject to a terminal disclaimer.

(21) Appl. No.: 14/958,301

(22) Filed: Dec. 3, 2015

(65) Prior Publication Data

US 2016/0158794 A1 Jun. 9, 2016

(30) Foreign Application Priority Data

Dec. 3, 2014 (KR) .................. 10-2014-0172290
Dec. 3, 2014 (KR) .................. 10-2014-0172291
Dec. 24, 2014 (KR) .................. 10-2014-0187801
Dec. 24, 2014 (KR) .................. 10-2014-0187804
May 27, 2015 (KR) .................. 10-2015-0073963
May 27, 2015 (KR) .................. 10-2015-0074007

(51) Int. Cl.
| | |
|---|---|
| G11C 11/401 | (2006.01) |
| G11C 16/04 | (2006.01) |
| B82Y 40/00 | (2011.01) |
| H01L 21/28 | (2006.01) |
| G11C 13/00 | (2006.01) |

(52) U.S. Cl.
CPC ........ *G11C 16/0466* (2013.01); *G11C 11/401* (2013.01); *B82Y 40/00* (2013.01); *G11C 13/0016* (2013.01); *G11C 2213/80* (2013.01); *H01L 21/28273* (2013.01); *Y10S 977/892* (2013.01)

(58) Field of Classification Search
CPC ................................................... G11C 11/401
See application file for complete search history.

(56) References Cited

U.S. PATENT DOCUMENTS

| | | | | | |
|---|---|---|---|---|---|
| 7,465,953 | B1 * | 12/2008 | Koh | .............. | B82Y 10/00 |
| | | | | | 257/213 |
| 9,257,660 | B2 * | 2/2016 | Kim | ............... | H01L 51/0001 |
| 9,281,484 | B2 * | 3/2016 | Kim | ............... | H01L 51/0566 |
| 2010/0203312 | A1 | 8/2010 | Bruckmann et al. | | |

(Continued)

FOREIGN PATENT DOCUMENTS

CN 104387416 3/2015

OTHER PUBLICATIONS

Kim, J. et al., Facile Preparative Route to Alkanethiolate-Coated Au38 Nanoparticles: Postsynthesis Core Size Evolution, Langmuir, 2007, pp. 7853-7858, vol. 23, No. 14.

(Continued)

*Primary Examiner* — Elizabeth A Burkhart
(74) *Attorney, Agent, or Firm* — IP & T Group LLP

(57) ABSTRACT

Provided are a method for fabricating nano structures which includes: preparing a substrate; preparing a polymer including a plurality of metal atoms; applying the polymer to the substrate to attach the metal atoms onto the substrate; and making one or more metallic nano particles from the metal atoms.

20 Claims, 7 Drawing Sheets

(56) References Cited

U.S. PATENT DOCUMENTS

| | | | |
|---|---|---|---|
| 2012/0256224 A1 | 10/2012 | Hatanaka et al. | |
| 2014/0252307 A1* | 9/2014 | Kim | H01L 51/0566 257/9 |
| 2014/0252315 A1* | 9/2014 | Kim | H01L 51/0001 257/24 |
| 2015/0179820 A1* | 6/2015 | Kim | H01L 21/28282 257/324 |
| 2016/0159988 A1 | 6/2016 | Kim | |

OTHER PUBLICATIONS

Carpenter, J. et al., Formation of Crystalline Nanoclusters of Ag, Cu, Os, Pd, Pt, Re, or Ru in a Silica Xerogel Matrix from Single-Source Molecular Precursors, Chem. Mater., 1997, pp. 3164-3170, vol. 9, No. 12.

Office Action issued by the USPTO for another application, U.S. Appl. No. 15/566,007 in the same family tree dated Mar. 11, 2019.

Pandey et al., "Size-dependence Enhancement in Electrocatalytic Activity of NiHCF-gold Nanocomposite: Potential Application in Electrochemical Sensing," Analyst (2012) 137, May 3, 2012, pp. 3306-3313, The Royal Society of Chemistry 2012.

Nishi et al., "Synthesis of Microsized Gold Plates with Nanometer Thickness via a Simple Solution Route using 3-mercaptop-propyltrimethoxysillance," the Journal of the Ceramic Society of Japan 115 (12), 2007, pp. 944-946.

* cited by examiner

NANO STRUCTURES, DEVICE USING THE SAME, AND METHOD FOR FABRICATING THE NANO STRUCTURES

CROSS-REFERENCE TO RELATED APPLICATIONS

The present application claims priority to Korean Patent Application Nos. 10-2014-0172290 and 10-2014-0172291, both filed on Dec. 3, 2014; 10-2014-0187801 and 10-2014-0187804, both filed on Dec. 24, 2014; and 10-2015-0073963 and 10-2015-0074007, both filed on May 27, 2015, which are herein incorporated by reference in their entirety.

BACKGROUND

1. Field

Various embodiments of the present disclosure relate to a polymer for fabricating nano structures, a device using the nano structures, and a method for fabricating the nano structures.

2. Description of the Related Art

Nano structures exhibit characteristics such as the quantum confinement effect, the Hall-Petch effect, dropping melting point, resonance phenomenon, excellent carrier mobility and so forth as compared to conventional bulk and thin film-type structures. For this reason, nano structures are being applied to chemical batteries, solar cells, semiconductor devices, chemical sensors, photoelectric devices and the like that require high level of integration and high efficiency.

Nano structures are fabricated in a top-down method or a bottom-up method. The bottom-up method includes a vapor-liquid-solid (VLS) growth method and a liquid growth method. The vapor-liquid-solid growth method is based on a catalytic reaction and includes methods such as the Thermal Chemical Vapor Deposition (thermal-CVD) method, the Metal-Organic Chemical Vapor Deposition (MOCVD) method, the Pulsed Laser Deposition (PLD) method, and the Atomic Layer Deposition (ALD) method. As for the liquid growth method, a self-assembly technology and a hydro-thermal method are being suggested.

According to the conventional bottom-up method, nano particles are prepared in advance and then attached to a substrate having a modified surface. However, this method not only has a limitation in decreasing the particle size of nano particles to less than about 5 nm but also deteriorates reproducibility and reliability of a nano semiconductor device due to non-uniformity of the size of the nano particles. That is, when using current methods of fabricating nano structures by simply attaching nano particles to a substrate, it is impossible to improve performance of the nano semiconductor device unless nano particles synthesis technology makes remarkable progress.

To overcome this limitation, nano structures may be fabricated in a top-down method such as lithography. However, the use of the top-down method requires a great deal of investment in equipment since a high-end lithography facility is needed. Moreover, since the process is quite complicated, it is not appropriate for mass-production. Additionally, although an etch process is performed using an electron beam, it is difficult to keep uniformity of the nano particle size at a predetermined level.

SUMMARY

Various embodiments are directed to nano structures that may be mass-produced with a short production time and at a low cost using a method to attain commercial viability, a device using the nano structures, and a method for fabricating the nano structures.

The embodiments are directed to nano structures having a particle size that may be controlled to be a desired particle size, a device using the nano structures, and a method for fabricating the nano structures.

Furthermore, the embodiments are directed to nano structures that may help an application device using the nano structures obtain operation stability, reproducibility, and reliability even when a scaling-down process is carried out, a device using the nano structures, and a method for fabricating the nano structures.

In an embodiment, a method for fabricating nano structures includes: preparing a substrate; preparing a polymer solution including metal atoms; applying the polymer solution to a substrate to attach the metal atoms onto the substrate; and aggregating the metal atoms to form metallic nano particles.

The preparing of the polymer solution including the plurality of metal atoms may include: mixing a metal precursor and an organic material in a solvent.

The sizes of the metallic nano particles may be controlled by controlling a mixing ratio of the metal precursor and the organic material.

The polymer solution may be applied to the substrate through a spin-coating process, and the sizes of the metallic nano particles may be controlled by controlling a spinning rate and time of the spin-coating process.

The method may further include: forming a nano particle layer by forming the metallic nano particles in plural.

The nano particle layer may be a one-nanoparticle-thick layer in which the metallic nano particles are arranged in two dimensions spaced apart from each other in horizontal and vertical directions.

The nano particle layer may be a multi-nanoparticle-thick layer in which the metallic nano particles are arranged in three dimensions spaced apart from each other.

The method may further include: forming a one-nanoparticle-thick layer or a multi-nanoparticle-thick layer by controlling a mixing ratio of the metal precursor and the organic material.

The metallic nano particles may be formed by reduction and growth of the metal atoms.

The substrate may include a hydrophilic surface layer, and the polymer may include a hydrophilic solvent.

The substrate may include a hydrophobic surface layer, and the polymer solution may include a hydrophobic solvent.

The method may further include: forming a protective layer that covers the metallic nano particles to fix the metallic nano particles onto the substrate, after the forming of the metallic nano particles, wherein the polymer is an organic material chain which is bonded with the plurality of the metal atoms.

The method may further include: removing the organic material remaining around the metallic nano particles before the protective layer is formed.

In another embodiment, a method for fabricating nano structures includes: preparing a substrate; individually forming a first polymer solution and a second polymer solution each of which includes a plurality of metal atoms; applying the first polymer solution to the substrate; forming a first nano particle layer by making a plurality of first metallic nano particles out of the metal atoms in the first polymer solution; applying the second polymer solution to the first nano particle layer; and forming a second nano particle layer by making a plurality of second metallic nano particles using the metal atoms in the second polymer solution.

The average particle diameter of the first metallic nano particles may be different from the average particle diameter of the second metallic nano particles.

The first metallic nano particles and the second metallic nano particles may be formed of different materials.

The average particle diameters of the first metallic nano particles and the second metallic nano particles may be controlled by differentiating concentrations of the metal atoms included in the first polymer solution and the second polymer solution, respectively.

The first polymer solution and the second polymer solution may be applied through a spin-coating process, and each of the first metallic nano particles and the second metallic nano particles may be formed into a one-nanoparticle-thick layer or a multi-nanoparticle-thick layer by controlling a spinning rate and time of the spin-coating process.

The first metallic nano particles and the second metallic nano particles may be formed by reduction and growth of the metal atoms.

The preparing of the substrate may include: forming guide grooves for arrangement of the first and second metallic nano particles on a surface of the substrate.

In another embodiment, a nano structure includes: a substrate where guide grooves are formed on a surface and the guide grooves are arranged in two dimensions spaced apart from each other in horizontal and vertical directions; and a plurality of metallic nano particles formed inside the guide grooves to correspond to the guide grooves.

The nano structure may further include: a dielectric material that covers the plurality of the metallic nano particles.

The metallic nano particles may be one selected from a group including metal nano particles, metal oxide nano particles, metal nitride nano particles, metal carbide nano particles, and intermetallic compound nano particles.

The dielectric material may be an organic material or an inorganic material.

The guide grooves may have longer depth than width.

The substrate may be a flexible substrate, and the flexible substrate may include a polymer containing one selected from a group including polyethylene terephthalate (PET), polyethylene naphthalate (PEN), polyimide (PI), polycarbonate (PC), polypropylene (PP), triacetyl cellulose (TAC), polyethersulfone (PES), and polydimethylsiloxane (PDMS), or a mixture thereof.

In another embodiment, a nano structure includes: a substrate; a first nano particle layer formed over the substrate and including a plurality of first metallic nano particles; and a second nano particle layer formed over the first nano particle layer and including a plurality of second metallic nano particles, wherein an average particle diameter of the first metallic nano particles is different from an average particle diameter of the second metallic nano particles.

The first metallic nano particles may be different from the second metallic nano particles.

The first nano particle layer further may include a first dielectric material that covers the first metallic nano particles.

The second nano particle layer may further include a second dielectric material that covers the second metallic nano particles.

The first nano particle layer may be a one-nanoparticle-thick layer in which the first metallic nano particles are arranged in one dimension, a one-nanoparticle-thick layer in which the first metallic nano particles axe arranged in two dimensions, or a multi-nanoparticle-thick layer in which the first metallic nano particles are arranged in three dimensions.

The second nano particle layer may be a one-nanoparticle-thick layer in which the second metallic nano particles are arranged in one dimension, a one-nanoparticle-thick layer in which the second metallic nano particles are arranged in two dimensions, or a multi-nanoparticle-thick layer in which the second metallic nano particles are arranged in three dimensions.

Each of the first and second metallic nano particles may be selected from a group including metal nano particles, metal oxide nano particles, metal nitride nano particles, metal carbide nano particles, and intermetallic compound nano particles.

The substrate may be a flexible substrate, and the flexible substrate may include a polymer containing one selected from a group including polyethylene terephthalate (PET), polyethylene naphthalate (PEN), polyimide (PI), polycarbonate (PC), polypropylene (PP), triacetyl cellulose (TAC), polyethersulfone (PES), and polydimethylsiloxane (PDMS), or a mixture thereof.

In another embodiment, a transistor includes: a channel region which includes guide grooves that are formed on a surface of a substrate and arranged in two dimensions spaced apart from each other in horizontal and vertical directions, and one or more metallic nano particles that are formed inside the guide grooves to correspond to the guide grooves; and a structure which is coupled with the channel region to control migration of electrons through the metallic nano particles.

The channel region may further include a dielectric material that covers the plurality of the metallic nano particles.

The metallic nano particles may be one selected from a group including metal nano particles, metal oxide nano particles, metal nitride nano particles, metal carbide nano particles, and intermetallic compound nano particles.

The dielectric material may be an organic material or an inorganic material.

The guide grooves may have longer depth than width.

In another embodiment, a transistor includes: a channel region which includes: a first nano particle layer that is formed over a substrate and includes a plurality of first metallic nano particles, and a second nano particle layer that is formed over the first nano particle layer and includes a plurality of second metallic nano particles, where an average particle diameter of the first metallic nano particles is different from an average particle diameter of the second metallic nano particles; and a structure which is coupled with the channel region to control migration of electrons through the first and second metallic nano particles.

The first metallic nano particles may be different from the second metallic nano particles.

The first nano particle layer may further include a first dielectric material that covers the first metallic nano particles.

The second nano particle layer may further include a second dielectric material that covers the second metallic nano particles.

The first nano particle layer may be a one-nanoparticle-thick layer in which the first metallic nano particles are arranged in one dimension, a one-nanoparticle-thick layer in which the first metallic nano particles are arranged in two dimensions, or a multi-nanoparticle-thick layer in which the first metallic nano particles are arranged in three dimensions.

The second nano particle layer may be a one-nanoparticle-thick layer in which the second metallic nano particles are arranged in one dimension, a one-nanoparticle-thick layer in which the second metallic nano particles are arranged in two dimensions, or a multi-nanoparticle-thick layer in which the second metallic nano particles are arranged in three dimensions.

Each of the first metal lie nano particles and the second metallic nano particles may be one selected from a group consisting of metal nano particles, metal oxide nano particles, metal nitride nano particles, metal carbide nano particles, and intermetallic compound nano particles.

In another embodiment, a sensor includes: a nano structure as an element for sensing a marker over a substrate, wherein the nano structure includes: guide grooves that are formed over a surface of the substrate and arranged in two dimensions spaced apart from each other in horizontal and vertical directions; and a plurality of metallic nano particles that are formed inside the guide grooves to correspond to the guide groove.

The sensor may further include: a receptor bonded with a surface of each of the metallic nano particles.

The receptor may be at least one selected from a group including enzyme-substrate, ligands, amino acids, peptides, proteins, nucleic acids, lipids and carbohydrates.

The metallic nano particles may be one selected from a group including metal nano particles, metal oxide nano particles, metal nitride nano particles, metal, carbide nano particles, and intermetallic compound nano particles.

The guide grooves may have longer depth than width.

In another embodiment, a semiconductor memory device includes: a nano structure as an element for storing or trapping a charge, wherein the nano structure includes: guide grooves that are formed on a surface of a substrate and arranged in two dimensions spaced apart from each other in horizontal and vertical directions; a plurality of metallic nano particles that are formed inside the guide grooves to correspond to the guide grooves; and a dielectric material that covers the plurality of the metallic nano particles.

The semiconductor memory device may further include: a tunnel insulation layer formed over the substrate; a floating gate formed over the tunnel insulation layer; a gate dielectric layer formed over the floating gate; and a control gate formed over the gate dielectric layer, wherein the floating gate includes the nano structure.

The semiconductor memory device may further include: a first oxide layer formed over the substrate; a charge trapping layer formed over the first oxide layer; a second oxide layer formed over the charge trapping layer; and a gate electrode formed over the second oxide, wherein the charge trapping layer includes the nano structure.

The semiconductor memory device may further include: a unit cell including an access transistor and a capacitor, wherein a channel region of the access transistor includes the nano structure.

The semiconductor memory device may further include: a unit cell including an access transistor and a capacitor, wherein the capacitor includes a first electrode, a second electrode, and the nano structure formed between the first electrode and the second electrode.

The capacitor may include a first electrode, a second electrode, and the nano structure formed between the first electrode and the second electrode.

The metallic nano particles may be selected from a group including metal nano particles, metal oxide nano particles, metal nitride nano particles, metal carbide nano particles, and intermetallic compound nano particles.

The dielectric material may be an organic material or an inorganic material.

The guide grooves may have longer depth than width.

In another embodiment, a semiconductor memory device includes: a nano structure as an element for storing or trapping a charge, wherein the nano structure includes: a first nano particle layer that includes a plurality of first metallic nano particles; and a second nano particle layer that is formed over the first nano particle layer and includes a plurality of second metallic nano particles, wherein an average particle diameter of the first metallic nano particles is different from an average particle diameter of the second metallic nano particles.

The semiconductor memory device may further include: a tunnel insulation layer formed over the substrate; a floating gate formed over the tunnel insulation layer; a gate dielectric layer formed over the floating gate; and a control gate formed over the gate dielectric layer, wherein the floating gate includes the nano structure.

The semiconductor memory may further include: a first oxide layer formed over the substrate; a charge trapping layer formed over the first oxide layer; a second oxide layer formed over the charge trapping layer; and a gate electrode formed over the second oxide layer, wherein the charge trapping layer includes the nano structure.

The semiconductor memory device may further include: a unit cell including an access transistor and a capacitor, wherein a channel region of the access transistor includes the nano structure.

The semiconductor memory device may further include: a unit cell including an access transistor and a capacitor, wherein the capacitor includes a first electrode, a second electrode, and the nano structure formed between the first electrode and the second electrode.

The capacitor may include a first electrode, a second electrode, and the nano structure formed between the first electrode and the second electrode.

The first metallic nano particles may be different from the second metallic nano particles.

The first and second nano particle layers may further include dielectric materials that cover the first and second metallic nano particles, respectively.

Each of the first nano particle layer and the second nano particle layer may be a one-nanoparticle-thick layer in which the corresponding metallic nano particles are arranged in one dimension, a one-nanoparticle-thick layer in which the corresponding metallic nano particles are arranged in two dimensions, or a multi-nanoparticle-thick layer in which the corresponding metallic nano particles are arranged in three dimensions.

In another embodiment, a capacitor includes: a first electrode formed in an upper portion of a substrate; a nano particle layer that is formed over the first electrode and includes a plurality of metallic nano particles arranged spaced apart from each other, and a dielectric material that covers the metallic nano particles; and a second electrode formed over the nano particle layer.

The nano particle layer may be a one-nanoparticle-thick layer in which the metallic nano particles are arranged in one dimension, a one-nanoparticle-thick layer in which the metallic nano particles are arranged in two dimensions, or a multi-nanoparticle-thick layer in which the metallic nano particles are arranged in three dimensions.

DETAILED DESCRIPTION

Figure 1:
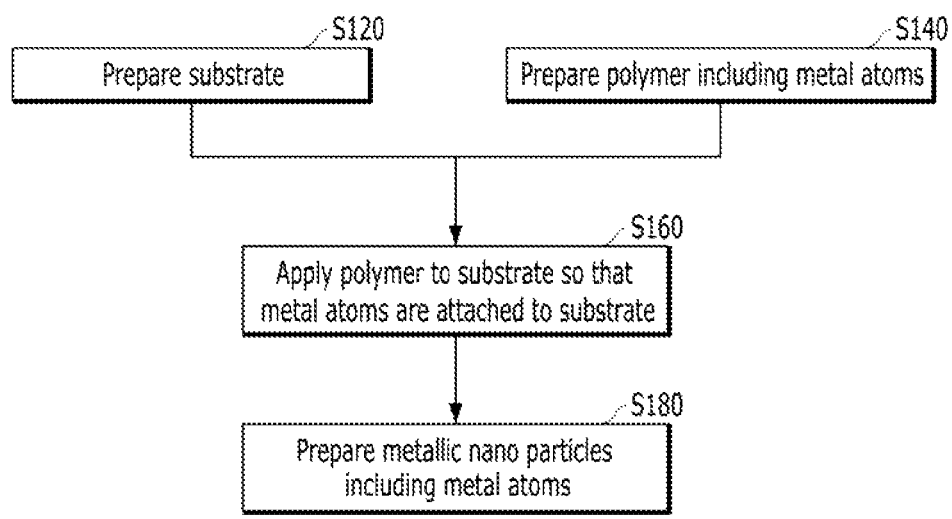
FIG. 1 is a flowchart illustrating a method for fabricating nano structures in accordance with an embodiment of the present disclosure.

Hereinafter, nano structures, a device using the nano structures, and a method for fabricating the nano structures according to embodiments of the present disclosure will be described in detail with reference to the accompanying drawings. The present disclosure may be embodied in different forms and should not be construed as limited to the embodiments set forth herein. Rather, these embodiments are provided so that this disclosure will be thorough and complete, and will fully convey the scope of the present disclosure to those skilled in the art. In addition, the drawings are not necessarily to scale and, in some instances, proportions may have been exaggerated to clearly illustrate features of the embodiments. Throughout the disclosure, reference numerals correspond directly to the like numbered parts in the various figures and embodiments of the present invention.

It should be understood that the meaning of "on" and "over" in the present disclosure should be interpreted in the broadest manner such that "on" means not only "directly on" but also "on" something with an intermediate feature(s) or a layer (s) therebetween, and that "over" means not only directly on top but also on top of something with an intermediate feature(s) or layer(s) therebetween. It is also noted that in this specification, "connected/coupled" refers to one component not only directly coupling another component but also indirectly coupling another component through an intermediate component. In addition, the singular form may include a plural form, and vice versa, as long as it is not specifically mentioned.

Unless otherwise mentioned, all terms used herein, including technical or scientific terms, have the same meaning as understood by those skilled in the technical field to which the present disclosure pertains. In the following description, a detailed description of well-known functions and configurations will be omitted when it may obscure the subject matter of the present disclosure.

FIG. 1 is a flowchart illustrating a method for fabricating nano structures in accordance with an embodiment of the present disclosure.

Referring to FIG. 1, the method for fabricating nano structures in accordance with the embodiment of the present disclosure may include: preparing a substrate in step S120, preparing a polymer including a plurality of metal atoms in step S140, applying the polymer to the substrate so that the metal atoms are attached to the substrate in step S160, and forming one or more metallic nano particles out of the metal atoms attached to the substrate in step S180.

Preparation of Substrate (S120)

The preparation of the substrate in the step S120 is described, hereafter, in detail.

The substrate may be a semiconductor substrate, a transparent substrate, or a flexible substrate. The material, structure, and shape of the substrate may differ according to application devices. Also, the substrate may serve as a physical support to the constituent elements of the application devices, or the substrate may be a raw material of the constituent elements.

Non-limiting examples of the flexible substrate include a flexible polymer substrate formed of polyethylene terephthalate (PET), polyethylene naphthalate (PEN), polyimide (PI), polycarbonate (PC), polypropylene (PP), triacetyl cellulose (TAC), polyethersulfone (PES), polydimethylsiloxane (PDMS), or a mixture thereof.

When using a semiconductor, the substrate may be an organic semiconductor, an inorganic semiconductor, or a stacked structure thereof.

Non-limiting examples of inorganic semiconductor substrates include a substrate made of: group 4 semiconductors, which include silicon (Si), germanium (Ge) and silicon germanium (SiGe); group 3-5 semiconductors, which include gallium arsenide (GaAs), indium phosphide (InP) and gallium phosphide (GaP); group 2-6 semiconductors, which include cadmium sulfide (CdS) and zinc telluride (ZnTe); group 4-6 semiconductors, which include lead sulfide (PbS); and a stack of two or more layers made of different materials selected from these materials. From the perspective of crystallography, the inorganic semiconductor substrate may foe a monocrystalline material, a polycrystalline material, an amorphous material, or a mixture of a crystalline material and an amorphous material. When an inorganic semiconductor substrate is a stacked structure of two or more layers, each layer may be a monocrystalline material, a polycrystalline material, an amorphous material, or a mixture of a crystalline material and an amorphous material.

Specifically, the inorganic semiconductor substrate may be a semiconductor substrate including a wafer, such as a silicon (Si) substrate, a semiconductor substrate with a surface oxide layer, or a Silicon On Insulator (SOI) substrate including a wafer.

When using an organic semiconductor substrate, the organic semiconductor substrate may be of an n-type organic semiconductor or a p-type organic semiconductor, which are typically used in the fields of an organic transistors, an organic solar cells, and an organic light emitting diodes (OLED). Non-limiting examples of organic semiconductors include fulleren-derivatives, such as copper-phthalocyanine (CuPc), poly(3-hexylthiophene) (P3HT), pentacene, sub-phthalocyanines (SubPc), fulleren (C60), [6,6]-phenyl-C61-butyric acid methyl ester (PCBM) and [6,6]-phenyl C70-butyric acid methyl ester (PC70BM), and tetrauorotetracyanoguinodimethane (F4-TCNQ). However, these examples of organic semiconductors are not intended to restrict the present disclosure.

The substrate may include a surface layer. For example, the substrate, e.g., a silicon substrate, may include a silicon dioxide ($SiO_2$) layer as its surface layer.

Specifically, the surface layer of the substrate may be a single layer of oxide, nitride, oxynitride, and silicate, or a stacked layer in which two or more of the materials are stacked. Non-limiting examples of the surface layer of the substrate include a single layer of silicon oxide, hafnium oxide, aluminum oxide, zirconium oxide, barium-titanium composite oxide, yttrium oxide, tungsten oxide, tantalum oxide, zinc oxide, titanium oxide, tin oxide, barium-zirconium composite oxide, silicon nitride, silicon oxynitride, zirconium silicate, hafnium silicate, a mixture thereof, and a composite thereof, or a stack of two or more layers.

The surface layer of the substrate may be a thin metal film. The thin metal film may have a thickness of about 100 nm or less. According to an embodiment of the present disclosure, the thin metal film may have a thickness of about 1 nm to 100 nm. When the thin metal film is extremely thin and as thin as about 1 nm or less, uniformity of the film, in thickness may deteriorate. Non-limiting examples of the material for the thin metal film, which is used as the surface layer, may include (i) transition metals including noble metals, (ii) non-transition metals, and (iii) a mixture thereof. Herein, examples of the transition metals include Sc, Y, La, Ac, Ti, Zr, Hf, V, Nb, Ta, Cr, Mo, W, Mn, Te, Re, Fe, Ru, Os, Co, Rh, Ir, Ni, Pd, Pt, Cu, Ag, Au, and mixtures thereof, and examples of the non-transition metals include Li, Na, K, Rb, Cs, Fr, Be, Mg, Ca, Sr, Ba, Ra, Zn, Cd, Al, Ga, In, Tl, Ge, Sn, Pb, Sb, Bi, Po, and mixtures thereof.

The surface layer may be formed through a thermal oxidation process, a physical deposition process, or a chemical deposition process. Non-limiting examples of the physical deposition process and the chemical deposition process include sputtering, magnetron-sputtering, e-beam evaporation, thermal evaporation, Laser Molecular Beam Epitaxy (L-MBE), Pulsed Laser Deposition (PLD), vacuum deposition, Atomic Layer Deposition (ALP), and Plasma Enhanced Chemical Vapor Deposition (PECVD).

When a flexible substrate is used, the surface layer of the substrate may be an organic material having a hydroxyl group (—OH).

Moreover, the surface of the substrate may be patterned in diverse forms, which will be described below. According to an embodiment of the present disclosure, a plurality of guide grooves may be patterned. The guide grooves induce metal atoms to agglomerate inside and thereby nano particles may be formed in the inside of the guide grooves. The guide grooves on the surface of the substrate may help to uniformly arrange the nano particles.

Preparation of Polymer Including Metal Atoms (S140)

Figure 2:
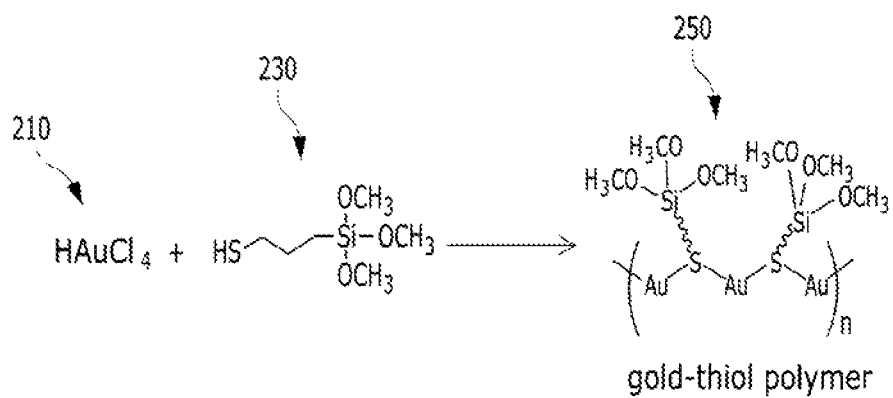
FIG. 2 illustrates how a polymer including metal is prepared.

FIG. 2 describes how a polymer 250 including metal atoms is prepared. Referring to FIG. 2, the polymer 250 including metal atoms is prepared by mixing a metal precursor 210 and an organic material 230 in a solvent.

FIG. 2 illustrates, for example, that $HAuCl_4$ is used as the metal precursor 210. The metal precursor 210 may vary depending on what the desired nano particle material is. For example, the metal precursor may be one or more metals selected from a group including transition metals, post-transition metals, and metalloids. In a non-limiting embodiment, the transition metal precursor may be a transition metal salt. Specifically, the transition metal may be one or more selected from a group including gold (Au), silver (Ag), ruthenium (Ru), palladium, (Pd), platinum (Pt) and copper (Cu). The transition metal salt may be selected from a group including halides, chalcogenides, hydrochlorides, nitrates, sulfates, acetates or ammonium salts of the transition metal. When the transition metal is Au, examples of the transition metal precursor include, but are not limited to, $HAuCl_4$, $AuCl$, $AuCl_3$, $Au_4Cl_8$, $KAuCl_4$, $NaAuCl_4$, $NaAuBr_4$, $AuBr_3$, $AuBr$, $AuF_3$, $AuF_5$, $AuI$, $AuI_3$, $KAu(CN)_2$, $Au_2O_3$, $Au_2S$, $Au_2S_3$, $AuSe$, $Au_2Se_3$, and the like.

The embodiment of FIG. 2 shows an example where 3-mercaptopropyltrimethoxysilane (3-MPTMS), which is one of silane-based compounds including a sulfuric functional group, is used as the organic material 230. However, other organic materials may be used in another embodiment.

For example, the organic material 230 may be one or more selected from a group including: [3-mercaptopropyl trimethoxysilane (3-MPTMS), 3-mercaptopropyl triethoxysilane, 11-mercaptoundecyl trimethoxysilane, mercaptomethyl methyl diethoxysilane, octyltrichlorosilane (OTS), hexamethyldisilazane (HMDS), octadecyltrichlorosilane (ODTS), (3-aminopropyl)trimethoxysilane (APS), (3-aminopropyl)triethoxysilane, N-(3-aminopropyl)-dimethyl-ethoxysilane (APDMES), perfluorodecyltrichlorosilane (PFS), mercaptopropyltrimethoxysilane (MPTMS), N-(2-aminoethyl)-3aminopropyltrymethoxysilane, (3-trimethoxysilylpropyl)diethylenetriamine, octadecyltrimethoxysilane (OTMS), (heptadecafluoro-1,1,2,2-tetrahydrodecyl)trichlorosilane (FDTS), dichlorodimethylsilane (DDMS), N-(trimethoxysilylpropyl)ethylenediamine triacetic acid, hexadecanethiol (HDT), and epoxyhexyltriethoxysilane.

In terms of ensuring stable isolation between the neighboring nano particles and between the nano particles and the substrate, the organic material 230 may include an alkane chain group, particularly an alkane chain group having 3 to 20 carbon atoms and may further include an oxygen-containing moiety. Examples of the oxygen-containing moiety include ethylene glycol (—O—$CH_2$—$CH_2$—), carboxylic acid (—COOH), alcohol (—OH), ether (—O—), ester (—COO—), ketone (—CO—), aldehyde (—COH) and/or amide (—NH—CO—), etc.

The solvent that is used for mixing the metal precursor 210 and the organic material 230 may foe a hydrophilic solvent or a hydrophobic solvent. When the surface of the substrate is hydrophilic, a hydrophilic solvent may be used. When the surface of the substrate is hydrophobic, a hydrophobic solvent may be used. This is to enhance the adhesion between the surface of the substrate and the polymer in a subsequent process.

Examples of the hydrophilic solvent may include (i) alcohols such as methanol, ethanol, 1-propanol, 2-propanol, 1-pentanol, 2-butoxyethanol and ethylene glycol, (ii) kentones such as acetone, 2-butanone and 4-methyl-2-propanone, or (iii) acids such as acetic acid.

Examples of the hydrophobic solvent may include (i) cycloalkanes or alkanes, such as pentane, hexane, decane, cyclohexane, cyclopentane and 2,2,4-trimethylpentane, alkenes such as 1-butylene, 2-butylene, 1-pentene, 2-pentene and isobutylene, or (ii) substituted alkanes such as carbon tetrachloride, 1-chlorobutane, 1-chloropentane, 2-chloropropane, 1-chloropropane, bromoethane, chloroform, dichloromethane, 1,2-dichloroethane, 1-nitropropane and nitromethane.

As described above, the polymer 250 including metal atoms is prepared by mixing the metal precursor 210 and the organic material 230, and FIG. 2 shows gold-thiol polymer. The polymer 250 including metal atoms Is an organic material chain that is bonded with a plurality of metal atoms.

The concentration of the metal atoms in the polymer 250 may be controlled by adjusting a mixing ratio of the metal precursor 210 and the organic material 230. This may be one of the significant factors for controlling the particle diameter of the nano particles to be prepared in the subsequent process. Additionally, the concentration of the polymer 250 including metal atoms may be one of the significant factors for controlling a density of the nano particles formed over the substrate and the number of the nano particle layers.

Application of Polymer to Substrate (S160)

When the substrate and the polymer are prepared, the polymer is applied to the substrate to attach the metal atoms included in the polymer onto the substrate.

The application of the polymer to the substrate may be performed diversely. According to an embodiment, the substrate may be coated with the polymer through a spin-coating process or a dipping process. As the polymer is applied to the substrate, the metal atoms included in the polymer are attached onto the substrate.

The concentration of the metal atoms may be controlled by controlling the spinning rate and time of the spin-coating process, which will be described later on. This may be one of the significant methods for controlling the particle diameter of the nano particles.

The substrate coated with the polymer including the metal atoms may be used for diverse semiconductor devices. That is, the manufacturers of the devices using the nano structures may be supplied with the substrates coated with the polymer including the metal atoms and use the substrates to produce desired devices.

Metallic Nano Particles Being Formed Off Metal Atoms (S180)

The metal atoms attached to the substrate are ionized. The metal atoms that is, ions become metallic nano particles through reduction and growth. The growth, herein, includes nucleation and agglomeration.

When energy is applied to the metal atoms, the metal atoms are reduced and grown into particles. The energy that is applied to form the nano particles may be one or more selected from a group including heat energy, chemical energy, light energy, vibration energy, atomic beam energy, electron beam energy, and radiation energy.

Thermal energy may include Joule heat and may be applied directly or indirectly. Direct application of thermal energy may be performed in a state in which a heat source and the substrate having metal atoms fixed thereto come into physical contact with each other. Indirect application of thermal energy may be performed in a state in which a heat source and the substrate having metal atoms fixed thereto do not come into physical contact with each other. Non-limiting examples of direct application include a method of placing a heating element, which generates Joule heat by the flow of electric current, beneath the substrate and transferring thermal energy to the metal atoms through the substrate. Non-limiting examples of indirect application include using a conventional heat-treatment furnace. For example, an object such as, a tube, to be heat-treated is placed in the conventional heat-treatment furnace. A heat insulation material surrounds the space to prevent heat loss. A heating element is placed inside the heat insulation material. A non-limiting example of indirect heat application is seen in the method of placing a heating element at a predetermined distance above the substrate where the metal atoms are fixed, and transferring thermal energy to the metal atoms through a fluid, including air, present between the substrate and the heating element.

Light energy may include light having a wavelength ranging from extreme ultraviolet to near-infrared, and application of light energy may include irradiation with light. According to a non-limiting embodiment, a light source may be placed above the substrate having the metal atoms fixed thereto at a predetermined distance from the metal atoms, and light from the light source may be irradiated onto the metal atoms.

Vibration energy may include microwaves and/or ultrasonic waves. Application of vibration energy may include irradiation with microwaves and/or ultrasonic waves. According to a non-limiting embodiment, a microwave and/or ultrasonic wave source may be placed above the substrate having the metal atoms fixed thereto at a predetermined distance from the metal atoms, and microwaves and/or ultrasonic waves from the source may be irradiated onto the metal atoms.

Radiation energy may include one or more selected from a group including $\alpha$ rays, $\beta$ rays and $\gamma$ rays. Radiation energy may be $\beta$ rays and/or $\gamma$ rays and used for reduction of the metal atoms. According to a non-limiting embodiment, a radiation source may be placed above the substrate, having the metal atoms fixed thereto, at a predetermined distance from the metal atoms and radiation from the source may be irradiated onto the metal atoms.

Energy may be kinetic energy of a particle beam, and the particle beam may include an atomic beam and/or an electron beam. In terms of the reduction of the metal atoms, atoms of the beam may be negatively charged. According to a non-limiting embodiment, an atom source or electron source may be placed above the substrate, having the metal atoms fixed thereto, at a predetermined distance from the metal atoms, and an atomic beam and/or electron beam may be applied to the metal atoms using an accelerating element that provides an electric field or magnetic field that accelerates atoms or electrons in the direction of the metal atoms.

Chemical energy is the Gibbs free energy difference between before and after a chemical reaction, and the chemical energy may include reduction energy. Chemical energy may include any energy capable of causing a reduction reaction with a reducing agent and may mean the energy capable of causing a reduction reaction in which the metal atoms are reduced by the reducing agent. According to a non-limiting embodiment, application of chemical energy may cause a reduction reaction in which the reducing agent is brought to the substrate having the metal atoms fixed thereto. The reducing agent may be supplied in the liquid or gaseous state.

In the preparation method according to an embodiment of the present disclosure, application of energy may include simultaneously or sequentially applying two or more selected from a group including heat energy, chemical energy, light energy, vibration energy, atomic beam beam energy, electron beam energy, and radiation energy.

According to a specific embodiment of simultaneous application, application of heat may be performed simultaneously with application of a particle beam. The particles of the particle beam may be heated by heat energy. In another specific embodiment of simultaneous application, application of heat may be performed simultaneously with application of a reducing agent. In still another embodiment of simultaneous application, application of a particle beam may be performed simultaneously with application of infrared rays or with application of microwaves.

Sequential application may mean that one kind of energy is applied and is followed by application of another kind of energy. It may also mean that different kinds of energy are continuously or discontinuously applied to the metal atoms. It is preferable that reduction of the metal atoms fixed to the substrate is performed before formation of nano particles. Thus, in a specific embodiment of sequential application, heat may be applied after addition of a reducing agent or after application of a negatively charged particle beam.

According to a non-limiting practical embodiment, application of energy may be performed using a rapid thermal processing (RTF) system, including a tungsten-halogen lamp, and the rapid thermal processing may be performed at a heating rate of about 50 to 150° C./sec. Also, rapid thermal processing may be performed in a reducing gas atmosphere or an inert gas atmosphere.

According to another non-limiting practical embodiment, application of energy may be performed by bringing a solution of a reducing agent into contact with the metal atoms followed by thermal processing using the rapid thermal processing system in a reducing gas atmosphere or an inert gas atmosphere.

According to a non-limiting practical embodiment, application of energy may be performed by generating an electron beam from an electron beam generator in a vacuum chamber and accelerating the generated electron beam to the metal atoms. The electron beam generator may be of a square type or a linear gun type. The electron beam generator may generate electron beam by generating plasma and extracting electrons from the plasma by using a shielding membrane. In addition, a heating element may be provided onto a holder for supporting the substrate in the vacuum chamber, and heat energy may be applied to the substrate by this heating element before, during, and/or after application of the electron beam.

When the desired nano particles are metal nano particles, the metal nano particles may be prepared in-situ by the application of energy as described above. When the nano particles to be prepared are not metal nano particles but metal compound nano particles, the metal compound nano particles may be prepared by supplying an element different from the metal atoms during or after the application of the above-described energy. Specifically, the metal compound nano particles may include metal oxide nano particles, metal nitride nano particles, metal carbide nano particles or intermetallic compound nano particles. More specifically, the metal compound nano particles may be prepared by supplying a different element in the gaseous or liquid state during or after the application of the above-described energy. In a specific embodiment, metal oxide nano particles may be prepared by supplying an oxygen source including oxygen gas during the application of energy. In addition, metal nitride nano particles may be prepared by supplying a nitrogen source including nitrogen gas during the application of energy. Metal carbide nano particles may be prepared by supplying a carbon source such as C1-C10 hydrocarbon gas during the application of energy. Intermetallic compound nano particles may be prepared by supplying a precursor gas containing a different element, which provides an intermetallic compound, during the application of energy. Specifically, the intermetallic compound nano particles may be prepared by carbonizing, oxidizing, nitrifying or alloying the metallic nano particles prepared by the application of the above-described energy.

The density of nano particles that is, the number of nano particles per unit surface area of a channel region, the particle size, and particle size distribution (that is, uniformity in particle size may be controlled by controlling one or more energy application conditions such as the type of energy, magnitude, temperature, and duration of energy application.

Moreover, it is possible to prepare metal oxide nano particles, metal nitride nano particles, metal carbide nano particles, or intermetallic compound nano particles by supplying the atoms from a heterogeneous atom source while energy is being applied or after energy is applied.

In a preparation method according to an embodiment of the present disclosure, i) the size of nano particles may be controlled by supplying an organic surfactant that is bonded with or adsorbed on the metal atoms, followed by the application of energy. Otherwise, ii) the size of nano particles may be controlled during the growth thereof by supplying an organic surfactant that is to be bonded with or adsorbed on the metal atoms during the application of energy. This supply of the organic surfactant may foe optionally performed during the preparation process. One or a plurality of organic surfactants may be used as the organic surfactant that is applied before or during the application of energy.

To more effectively inhibit the migration of the metal atoms, a first organic material and a second organic material that are different from each other may be used as the organic surfactant.

The first organic material may be a nitrogen- or sulfur-containing organic material. For example, the sulfur-containing organic material may include a linear or branched hydrocarbon compound having a thiol group as an end group. In a specific example, the sulfur-containing organic material may be one or more of HS—$C_n$—$CH_3$ (n: an integer ranging from 2 to 20), n-dodecyl mercaptan, methyl mercaptan, ethyl mercaptan, butyl mercaptan, ethylhexyl mercaptan, isooctyl mercaptan, tert-dodecyl mercaptan, thioglycolacetic acid, mercaptopropionic acid, mercaptoethanol, mercaptopropanol, mercaptobutanol, mercaptohexanol, and octyl thioglycolate.

The second organic material may be a phase-transfer catalyst-based organic material, for example, quaternary ammonium or a phosphonium salt. More specifically, the second organic material may be one or more of tetraocylammonium bromide, tetraethylammonium, tetra-n-butylammonium bromide, tetramethylammonium chloride, and tetrabutylammonium fluoride.

This organic surfactant may inhibit migration of the metal atoms during the application of energy, thereby forming more uniform and finer nano particles. Since the metal atoms bond with the organic surfactant, these metal atoms require higher activation energy compared to when they diffuse in order to participate in nucleation or growth. In addition, when the metal atoms bond to the organic surfactant, the diffusion thereof is physically inhibited by the organic surfactant. Thus, the diffusion of the metal atoms may be slower and the number of the metal atoms that participate in the growth of nuclei may be decreased.

In a preparation method according to an embodiment of the present disclosure, energy may be applied to the entire area simultaneously or applied to a portion of the region having the metal atoms. When energy is applied to a portion of the metal atom region, energy may be irradiated in a spot, line or predetermined plane shape. In a non-limiting embodiment, energy may be applied that is, irradiated in spots while the entire metal atom region may foe scanned. The application of energy to a portion of the metal atom region may be performed by irradiating energy in a spot, line or plane shape while the entire metal atom region is scanned or by irradiating energy only to a specific portion of the metal atom region without a scanning process. As described above, a pattern of nano particles may be formed by applying energy to a portion. Furthermore, application that is, irradiation of energy to a portion of a region makes it possible to form a pattern of nano particles.

Hereafter, diverse forms of nano structures are described in accordance with embodiments of the present disclosure.

Figure 3:
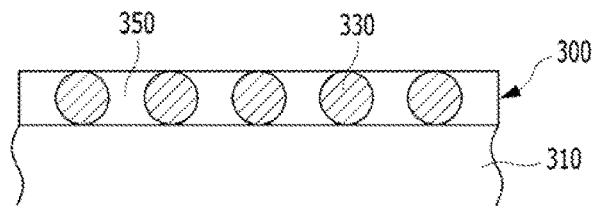
FIG. 3 is a cross-sectional view illustrating a nano particle layer formed over a substrate.

FIG. 3 is a cross-sectional view illustrating a nano particle layer 300 formed over a substrate 310 where a plurality of metallic nano particles 330 are spaced apart from each other.

Figure 4A:
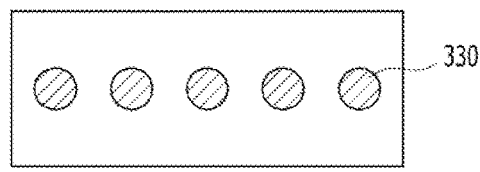
FIG. 4A is a plan view of a nano particle layer which is a one-nanoparticle-thick layer and in which nano particles are arranged in one dimension.
Figure 4B:
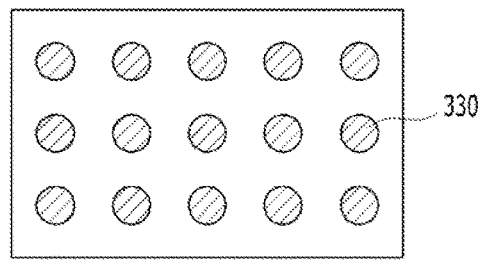
FIG. 4B is a plan view of a nano particle layer which is a one-nanoparticle-thick layer and in which nano particles are arranged in two dimensions.
Figure 4C:
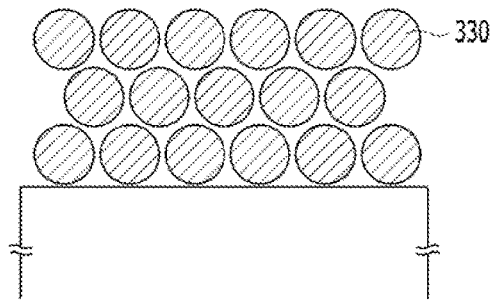
FIG. 4C is a side view of a nano particle layer which is a multi-nanoparticle-thick layer and in which the nano particles are arranged in three dimensions.

As shown in FIG. 4A, the nano particle layer 300 may be arranged side by side to form a one-nanoparticle-thick layer. That is, the nano particle layer 300 may have a thickness which is substantially the same as a diameter of a single nanoparticle. The nano particles are arranged in one dimension and spaced apart from each other. As shown in FIG. 4B, the nano particle layer 300 may be one-nanoparticle-thick layer. The nano particles are arranged in two dimensions and spaced apart from each other. Referring to FIG. 4C, the nano particle layer 300 may be a multi-nanoparticle-thick layer. The nano particles are arranged in three dimensions and spaced apart from each other.

Each of the nano particles may have a particle diameter of about 0.5 nm to 3 nm.

The diameter of the metallic nano particles 330 may be decided based on the concentration of the metal atoms included in a polymer used for the preparation process. That is, the diameter of the nano particles may be controlled by adjusting the mixing ratio of a metal precursor and an organic material when the polymer is prepared. For example, when the mixing ratio of the metal precursor to the organic material falls in the range of about 1:3 to 1:7, nano particles having a diameter of about 1.4 nm to 1.9 nm may be prepared. When the mixing ratio of the metal precursor to the organic material falls in the range of about 1:8 to 1:12, nano particles having a diameter of about 1.0 nm to 1.3 nm may be prepared.

It is also possible to control the diameter and density of the nano particles by controlling a spinning rate and time when the substrate is spin-coated with the polymer. Besides, the diameter of the nano particles may be controlled by controlling the conditions of energy application that is performed to reduce and grow the metal atoms.

As described earlier, the nano particle layer 300 may be formed in a one-nanoparticle-thick layer or a multi-nanoparticle-thick layer, and the nano particle layer 300 may be formed in a structure of a one-nanoparticle-thick layer or a multi-nanoparticle-thick layer by controlling the concentration of the metal atoms that is, ions in the inside of the polymer or by controlling the conditions of the spin-coating process.

Referring back to FIG. 3, the nano particle layer 300 may include a dielectric material 350 covering the metallic nano particles 330.

After the formation of the metallic nano particles 330, an organic material originated from the polymer or an organic surfactant may remain around the metallic nano particles 330 or may be removed. While the organic material remains or while the organic material is removed, a protective layer may be formed to fix and protect the metallic nano particles 330, and the protective layer may be of an inorganic material.

Therefore, the dielectric material 350 may be (i) the organic material originated from the polymer or the organic surfactant, or (ii) an inorganic material such as an oxide or a nitride.

Figure 5:
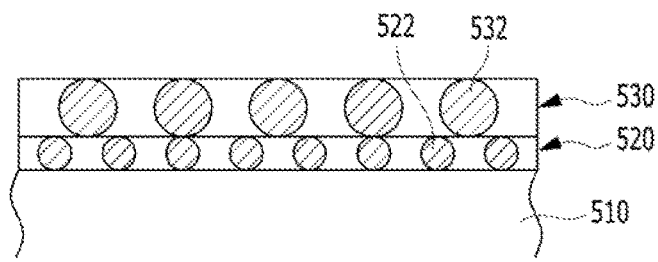
FIG. 5 is a cross-sectional view illustrating a stack of multiple nano particle layers.

FIG. 5 is a cross-sectional view illustrating a stack of multiple nano particle layers each of which contains nano particles of a different material and/or a different particle size.

Referring to FIG. 5, a first nano particle layer 520 may be formed over a substrate 510, and a second nano particle layer 530 may be formed over the first nano particle layer 520. The first nano particle layer 520 may include a plurality of nano particles 522 that are spaced apart from each other. The second nano particle layer 530 may also include a plurality of nano particles 532 that are spaced apart from each other. Herein, the average particle diameter of the nano particles 522 of the first nano particle layer 520 and the average particle diameter of the nano particles 532 of the second nano particle layer 530 may be different. Also, the nano particles 522 of the first nano particle layer 520 and the nano particles 532 of the second nano particle layer 530 may be of different materials. For example, the nano particles 522 and the nano particles 532 may be of a homogeneous metal or metal compound. The metal compounds may include, for example, a metal oxide, a metal nitride, or a heterogeneous metal compound. The nano particles 522 and the nano particles 532 may be of different materials.

The first nano particle layer 520 and the second nano particle layer 530 may be formed in accordance with the embodiment of the present disclosure, which is described above. Herein, the diameters of the nano particles 522 and the nano particles 532 may be controlled by differentiating the concentrations of the metal atoms included in a first polymer for forming the first nano particle layer 520 and the metal atoms included in a second polymer for forming the second nano particle layer 530.

Also, the diameters of the nano particles 522 and the nano particles 532 may be controlled by controlling the spinning rate and time of the spin-coating process for spin-coating the substrate 510 with the first polymer and the second polymer.

Although FIG. 5 shows a stacked structure of two nano particle layers, the spirit and concept of the present disclosure are not limited to it and the nano structures may include a plurality of nano particle layers that are stacked perpendicularly over a substrate. Each of the stacked nano particle layers may be an one-nanoparticle-thick layer where nano particles are arranged in one dimension or in two dimensions spaced apart from each other, or it may be a multi-nanoparticle-thick layer in which the nano particles are arranged in three dimensions spaced apart from each other. Also, each of the nano particle layers may include a dielectric material, which is an organic material or an inorganic material, covering the nano particles, and the dielectric material may serve as a protector for protecting the nano particles.

Figure 6A:
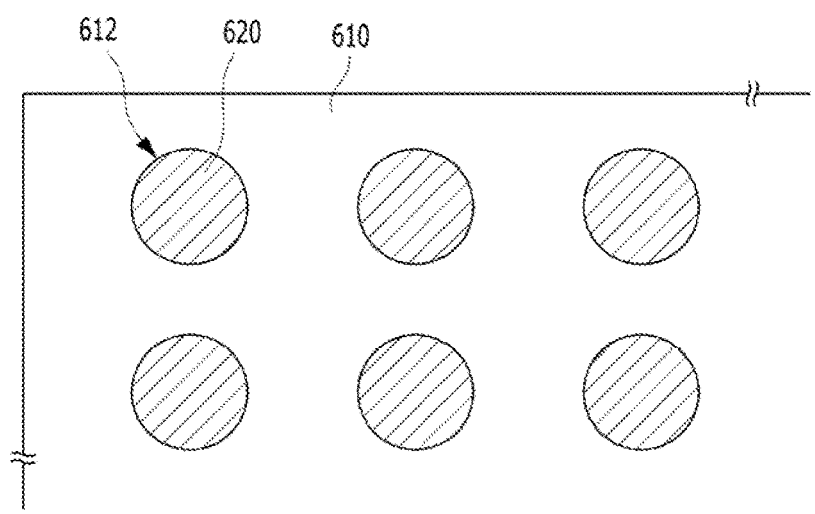
FIG. 6A is a plan view of nano structures in accordance with a second embodiment of the present disclosure.

FIG. 6A is a plan view of nano structures in accordance with a second embodiment of the present disclosure. FIG.

Figure 6B:
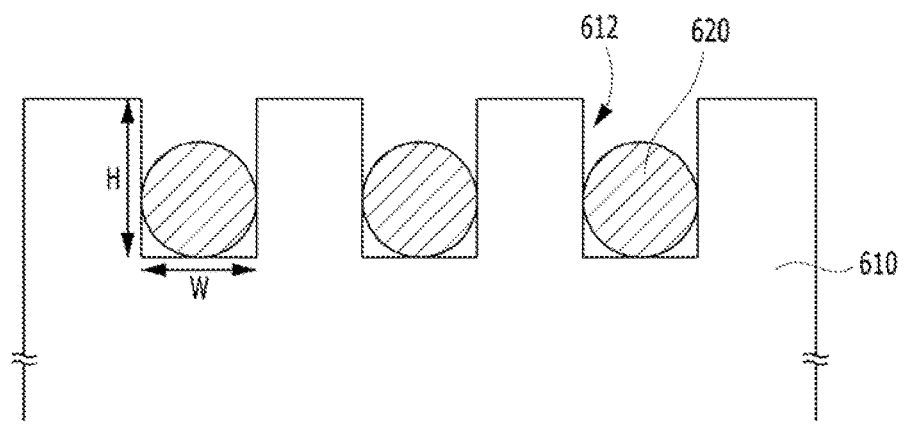
FIG. 6B is a cross-sectional view of the nano structures in accordance with the second embodiment of the present disclosure, the cross-sectional view illustrating guide grooves formed on the surface of a substrate to facilitate uniform arrangement of nano particles.

6B is a cross-sectional view of the nano structures in accordance with the second embodiment of the present disclosure. FIG. 6B illustrates guide grooves 612 formed on the surface of a substrate 610 to facilitate the arrangement of nano particles 620.

The substrate 610 may include a surface layer, and the surface layer may include the guide grooves 612. When the substrate 610 including the guide grooves 612 on its surface is coated with a polymer including metal atoms, the metal atoms are reduced and grown, the metal atoms migrate into the guide grooves 612 to agglomerate together, and then the agglomerated metal atoms form nano particles 620 in the inside of the guide grooves 612. In this way, the nano particles 620 may be arranged depending on the arrangement of the guide grooves 612. Also, the guide grooves 612 may help the nano particles 620 to become fixed on the substrate 610.

Referring to FIG. 6B, the guide grooves 612 may be formed to have longer depth H than width W. For example, when the width W is about 2 nm, the depth H may be formed in about 4 nm. This causes the metal atoms outside of the guide grooves 612 to migrate into the inside of the guide grooves 612 more easily and agglomerate.

Described hereafter are diverse devices using the nano structures in accordance with the above embodiments of the present disclosure and a method for fabricating the nano structures.

Figure 7A:
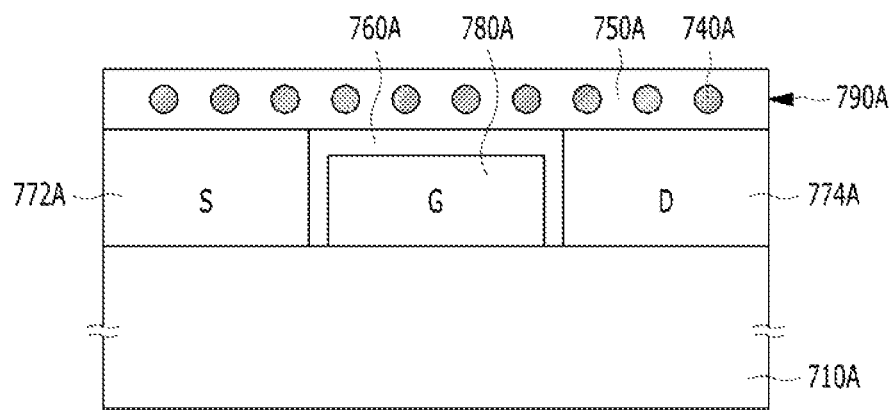
FIG. 7A is a cross-sectional view illustrating a single electron transistor in accordance with an embodiment of the present disclosure.

FIG. 7A is a cross-sectional view illustrating a single electron transistor in accordance with an embodiment of the present disclosure.

Referring to FIG. 7A, the single electron transistor in accordance with the embodiment of the present disclosure includes a gate 730A formed over a substrate 710A, a source region 772A disposed on one side of the gate 780A, a drain region 774A disposed on the other side of the gate 780A, and a channel region 790A is formed over the gate 780A and between the source region 772A and the drain region 774A. A dielectric layer 760A may be disposed between the channel region 790A and the gate 780A. The gate 780A is also insulated from the source region 772A and the drain region 774A.

Figure 7B:
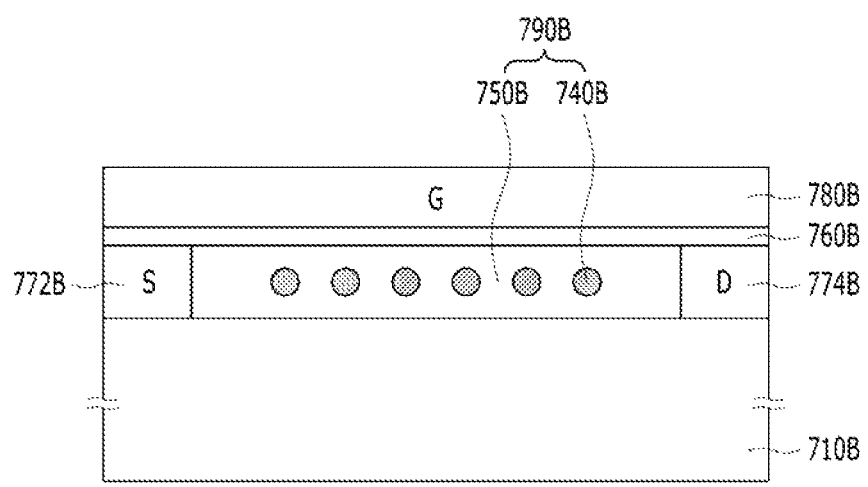
FIG. 7B is a cross-sectional view illustrating a single electron transistor in accordance with another embodiment of the present disclosure.

FIG. 7B is a cross-sectional view illustrating a single electron transistor in accordance with another embodiment of the present disclosure.

Referring to FIG. 7B, the single electron transistor in accordance with the embodiment of the present disclosure includes a channel region 790B formed over a substrate 710B, a source region 772B disposed on one side of the channel region 790B, a drain region 774B disposed on the other side of the channel region 790B, and a gate 780B formed over the channel region 790B, the source region 772B, and the drain region 774B. The single electron transistor may further include a gate dielectric layer 760B between the channel region 790B and the gate 780B.

In the single electron transistors in accordance with the embodiments of the present disclosure, the nano structures in accordance with the above-described embodiments of the present disclosure are applied to the channel regions 790A and 790B. The present disclosure may be applied to all types of transistors including the channel regions 790A and 790B, although the structures of the transistors are different from the structures shown in FIGS. 7A and 7B.

The channel regions 790A and 790B may be formed similar to the nano structures described with reference to FIGS. 6A and 6B. That is, the channel regions 790A and 790B may include guide grooves (refer to '612' of FIGS. 6A and 6B) arranged on the surface of the substrate and a plurality of metallic nano particles 740A and 740B that are formed in the inside of the guide grooves. The guide grooves may be formed to have longer depth than width.

Additionally, the channel regions 790A and 790B may further include dielectric materials 750A and 750B that cover the metallic nano particles 740A and 740B, respectively. Herein, each of the metallic nano particles 740A and 740B may for one selected from a group including metal nano particles, metal oxide nano particles, metal nitride nano particles, metal carbide nano particles, and intermetallic compound nano particles. The dielectric material 750A and 750B may be an organic material or an inorganic material.

Moreover, the channel regions 790A and 790B may be formed similar to the nano structures described with reference to FIG. 5. Specifically, the channel regions 790A and 790B may include a first nano particle layer containing first metallic nano particles and a second nano particle layer formed over the first nano particle layer and containing second metallic nano particles, respectively. The average particle diameter of the first metallic nano particles may be different from the average particle diameter of the second metallic nano particles. The first metallic nano particles and the second metallic nano particles may be of different materials. That is, the first metallic nano particles and the second metallic nano particles may be one selected from a group including metal nano particles, metal oxide nano particles, metal nitride nano particles, metal carbide nano particles, and intermetallic compound nano particles, and the first metallic nano particles and the second metallic nano particles may be different materials from each other.

The first nano particle layer and the second nano particle layer that form the channel regions 790A and 790B, respectively, may further include dielectric materials that cover the metallic nano particles 740A and 740B, respectively. Furthermore, each of the first nano particle layer and the second nano particle layer that form the channel regions 790A and 790B, respectively, may be a one-nanoparticle-thick layer where nano particles are arranged in one dimension spaced apart from each other, an one-nanoparticle-thick layer in which nano particles are arranged in two dimensions spaced apart from each other, or a multi-nanoparticle-thick layer in which nano particles are arranged in three dimensions spaced apart from each other.

The source regions 772A and 772B, the drain region 774A and 774B, and the gates 780A and 780B are structures combined with the channel regions 790A and 790B, respectively, to control the migration of single electrons through the metallic nano particles 740A and 740B, respectively.

Although the embodiments of the present disclosure describe single electron transistors whose operation is controlled based on the migration of single electrons, the technology of the present disclosure may be applied not only the single electron transistors but also to other transistors. That is, the concept and spirit of the present disclosure may be applied to transistors that operate based on the migration of two or more electrons.

The channel regions of the single electron transistors in accordance with the diverse embodiments of the present disclosure may be formed in a method that is substantially the same as the above-described methods for fabricating the nano structures in accordance with the diverse embodiments of the present disclosure. In short, the channel regions of the single electron transistors may be formed by providing a substrate, preparing a polymer including a plurality of metal atoms, and applying the polymer to the substrate to attach the metal atoms onto the substrate. Subsequently, the metal atoms may be formed into at least one metallic nano particles, and then the gates, sources and drains, which are structures for controlling migration of single electrons through the metallic nano particles, may be formed.

Figure 8:
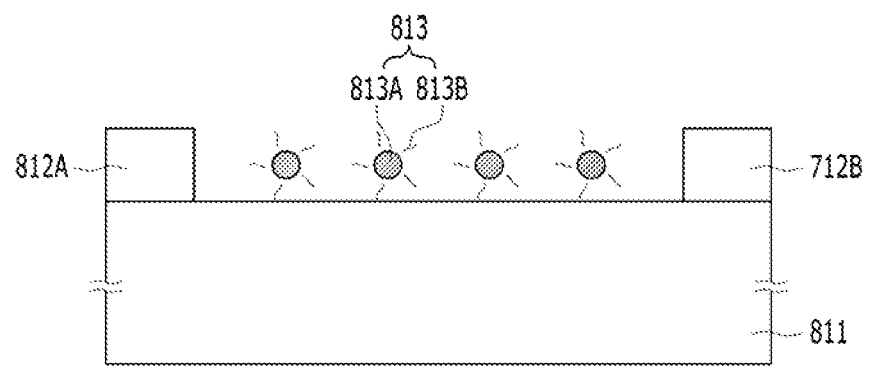
FIG. 8 is a cross-sectional view illustrating a sensor in accordance with an embodiment of the present disclosure.

FIG. 8 is a cross-sectional view illustrating a sensor in accordance with an embodiment of the present disclosure.

Referring to FIG. 8, an anode 812A and a cathode 812B are formed over a substrate 811 to face against each other. Additionally, nano structures 813 are formed over the substrate 811 to sense markers. The nano structures 813 may include metallic nano particles 813A and receptors 813B that are combined with the surfaces of the metallic nano particles 813A. The shape and material of the substrate 811 may vary according to the application field. The sensor in accordance with the embodiment of the present disclosure is not limited to the structure shown in FIG. 8. When the technology of the present disclosure is applied to the known diverse three-dimensional platforms, the disposition and shape of the nano structures 813 may be different. When the surroundings of the nano structures 813 have metallic nano particles as the sensing elements for sensing markers such as light, enzyme, virus, gas and heavy metal, with no regard to the structure and material of the surroundings, the sensor platform of the present disclosure may be applied to diverse embodiments.

The nano structures 813 of the sensor may be fabricated similar to the nano structures described above with reference to FIGS. 6A and 6B. Thus, the sensing region may include guide grooves (refer to '612' of FIG. 6) arranged on the surface of a substrate, and a plurality of metallic nano particles that are formed in the inside of the guide grooves. The guide grooves may be formed to have a longer depth than width.

All types of materials that may react with markers, such as proteins, nucleic acids, oligosaccharides, amino acids, carbohydrates, solution gas, sulfur oxide gas, nitrogen oxide gas, pesticide residue, heavy metal, and environmentally hazardous substances may be used as the receptors 813B. The receptors 813B may be selected from a group including enzyme-substrate, ligands, amino acids, peptides, proteins, nucleic acids, lipids and carbohydrates, or a combination thereof. Each of the receptors 813B may have at least one functional group selected from a group including an amine group, carboxylic group, and a thiol group. The selected functional group makes it possible for the receptors 813B to bond with the metallic nano particles 813A.

The nano structures 813 of the sensor in accordance with the diverse embodiments of the present disclosure described above may be fabricated in a method that is substantially the same as the above-described method for fabricating nano structures in accordance with the embodiments of the present disclosure. Specifically, the nano structures 813 may be prepared by preparing a substrate, preparing a polymer including a plurality of metal atoms, applying the polymer to the substrate to attach the metal atoms onto the substrate, forming the metal atoms into at least one metallic nano particles, and bonding the receptors with the surface of the metallic nano particles.

Figure 9:
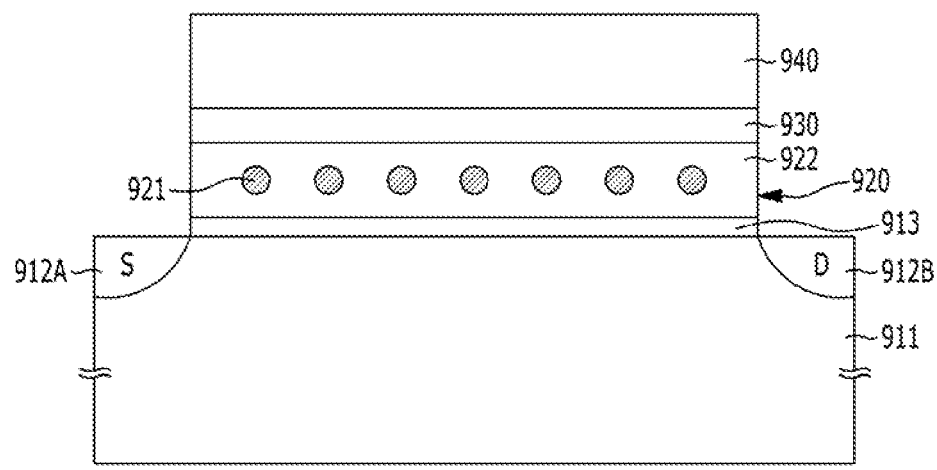
FIG. 9 is a cross-sectional view illustrating a non-volatile memory device in accordance with an embodiment of the present disclosure.

FIG. 9 is a cross-sectional view illustrating a non-volatile memory device in accordance with an embodiment of the present disclosure.

Referring to FIG. 9, a tunnel insulation layer 913, such as a silicon oxide layer, is formed over a semiconductor substrate 911. A nano floating gate 920 may be formed over the tunnel insulation layer 913. The nano floating gate 920 includes a one-nanoparticle-thick layer or a multi-nanoparticle-thick layer of nano particles 921. The nano floating gate 920 may include a dielectric material 922 that surrounds the nano particles 921. A gate dielectric layer 930 is formed over the nano floating gate 920, and a control gate 940 is formed over the gate dielectric layer 930.

The tunnel insulation layer 913, the nano floating gate 920, the gate dielectric layer 930, and the control gate 940 may be patterned over the semiconductor substrate 911 to form a gate stack. A source 912A and a drain 912B may be formed in the semiconductor substrate 911 on the sides of the gate stack. The nano floating gate of the present disclosure, however, is not limited to the memory cell of the simple stack structure shown in FIG. 9. Thus, when it is applied to the memory cells of the known diverse three-dimensional structures, the disposition and shape of the nano floating gate may be different, and the elements in the upper and lower portions and sides of the nano floating gate may be different as well. Specifically, a tunnel insulation layer, a source, and a drain, which are cell elements, may be positioned on the sides of a nano floating gate. Herein, any floating gate capable of performing a charge/discharge function may be used as the nano floating gate of the present disclosure no matter which elements and material are present in the surrounding of the floating gate.

Since the nano particles 921 that are not electrically connected with each other store charges in the non-volatile memory device including the nano floating gate 920, it is possible to minimize the loss of data that may be caused by deterioration of the tunnel insulation layer 913. Also, the non-volatile memory device including the nano floating gate has excellent data retention characteristics and may be scaled down for low power consumption and perform a program/erase operation through direct tunneling at a low voltage level, and its operation rate may be improved remarkably.

In the non-volatile memory device in accordance with the embodiment of the present disclosure, the nano structures described above are applied to the nano floating gate 920.

The nano floating gate 920 may fee formed similar to the nano structures described with reference to FIGS. 6A and 6B. The nano floating gate 920 may include guide grooves (refer to '612' of FIGS. 6A and 6B) arranged on the surface of the dielectric material 922 and a plurality of metallic nano particles 921 that are formed in the inside of the guide grooves. The guide grooves may be formed to have a longer depth than width.

The nano floating gate 920 may further include a dielectric material 922 that covers the metallic nano particles 921. Herein, the metallic nano particles 921 may be selected from a group including metal nano particles, metal oxide nano particles, metal nitride nano particles, metal carbide nano particles, and intermetallic compound nano particles. The dielectric material 922 may be an organic material or an inorganic material.

Moreover, the nano floating gate 920 may be formed similar to the nano structures described with reference to FIG. 5. That is, the nano floating gate 920 may include a first nano particle layer containing first metallic nano particles and a second nano particle layer formed over the first nano particle layer and containing second metallic nano particles. The average particle diameter of the first metallic nano particles may be different from the average particle diameter of the second metallic nano particles. The first metallic nano particles and the second metallic nano particles may be of different materials. Additionally, the first metallic nano particles and the second metallic nano particles may be selected from a group including metal nano particles, metal oxide nano particles, metal nitride nano particles, metal carbide nano particles, and intermetallic compound nano particles. The first metallic nano particles and the second metallic nano particles may be different materials from each other.

Each of the first nano particle layer and the second nano particle layer that form the nano floating gate 920 may further include a dielectric material that covers the corresponding metallic nano particles. Also, each of the first nano particle layer and the second nano particle layer that form the nano floating gate 920 may be a one-nanoparticle-thick layer in which nano particles axe arranged in one dimension spaced apart from each other, a one-nanoparticle-thick layer in which nano particles are arranged in two dimensions spaced apart from each other, or a multi-nanoparticle-thick layer in which nano particles are arranged in three dimensions spaced apart from each other.

The nano floating gate 920 described above in accordance with the diverse embodiments of the present disclosure may be formed using a method that is substantially the same as the above-described method for fabricating nano structures in accordance with the embodiments of the present disclosure.

Figure 10:
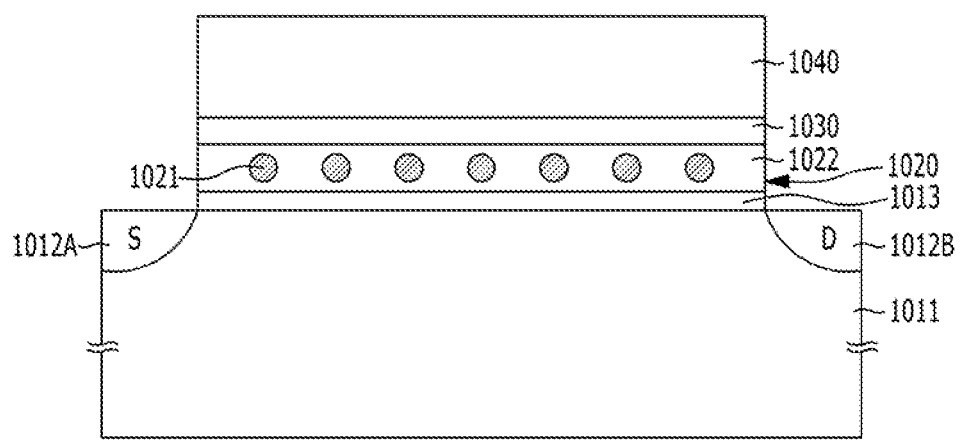
FIG. 10 is a cross-sectional view illustrating a charge-trapping non-volatile memory device in accordance with an embodiment of the present disclosure.

FIG. 10 is a cross-sectional view illustrating a unit cell structure of a charge-trapping non-volatile memory device in accordance with an embodiment of the present disclosure.

Referring to FIG. 10, a first oxide layer 1013 may be formed over a semiconductor substrate 1011. The first oxide layer 1013 serves as a tunnel layer. A charge trapping layer 1020 may be formed over the first oxide layer 1013. The charge trapping layer 1020 may include a plurality of nano particles 1021, and a nitride 1022 that surrounds the nano particles 1021. For example, the nitride 1022 may be a silicon, nitride ($Si_3N_4$). A second oxide layer 1030 is formed over the charge trapping layer 1020, and a gate 1040 may be formed over the second oxide layer 1030. The second oxide layer 1030 functions as a gate dielectric material.

The first oxide layer 1013, the charge trapping layer 1020, the second oxide layer 1030, and the gate 1040 may be patterned over the semiconductor substrate 1011 to form a gate stack. A source 1012A and a drain 1012B may be formed in the semiconductor substrate 1011 on the sides of the gate stack. The memory cell of the non-volatile memory device in accordance with the embodiment of the present disclosure is not limited to the memory cell of a simple stack structure shown in FIG. 10. When the technology of the present disclosure is applied to unit cells of known diverse three-dimensional structures, the position and shape of the charge trapping layer may be different, and the elements in the upper and lower portions and sides of the charge trapping layer may be different as well. Specifically, the charge trapping layer may have a vertical pillar shape, and such elements as gates may be disposed on the sides of the charge trapping layer. The spirit and concept of the present disclosure may be applied to all devices having a charge trapping layer regardless of the elements and material in the surrounding of the charge trapping layer.

The above-described non-volatile memory device in accordance with the embodiment of the present disclosure includes the charge trapping layer 1020 that is improved. The improved charge trapping layer 1020 includes the high-density nano particles 1021 that are extremely fine and have a uniform particle size.

As is well known in conventional art, a nitride layer alone serves as a charge trapping site. The nitride layer, however, is not dense or uniform enough to ensure sufficient data retention time. In the charge trapping layer 1020 formed in accordance with the embodiment of the present disclosure, the nano particles 1021 are added in the nitride 1022. The nano particles 1021 have a high density, high uniformity and fine particle size. Thus, the charge trapping layer 1020 may have improved charge trapping characteristics compared to the conventional nitride layer.

Moreover, the charge trapping layer 1020 may be formed similar to the nano structures described with reference to FIG. 5. Specifically, the charge trapping layer 1020 may include a first nano particle layer containing first metallic nano particles and a second nano particle layer formed over the first nano particle layer and containing second metallic nano particles. The average particle diameter of the first metallic nano particles may be different from the average particle diameter of the second metallic nano particles. The first metallic nano particles and the second metallic nano particles may be different materials. That is, each of the first metallic nano particles and the second metallic nano particles may be selected from a group including metal nano particles, metal oxide nano particles, metal nitride nano particles, metal carbide nano particles, and intermetallic compound nano particles. Furthermore, the first metallic nano particles and the second metallic nano particles may be different materials from each other.

The first nano particle layer and the second nano particle layer that form the charge trapping layer 1020 may further include a nitride that covers the metallic nano particles. Each of the first nano particle layer and the second nano particle layer that form the charge trapping layer 1020 may be a one-nanoparticle-thick layer in which nano particles are arranged in one dimension spaced apart from each other, a one-nanoparticle-thick layer in which nano particles are arranged in two dimensions spaced apart from each other, or a multi-nanoparticle-thick layer in which nano particles are arranged in three dimensions spaced apart from each other.

The charge trapping layer 1020 described above in accordance with the diverse embodiments of the present disclosure may be formed using a method that is substantially the same as the above-described method for fabricating nano structures in accordance with the embodiments of the present disclosure.

Figure 11:
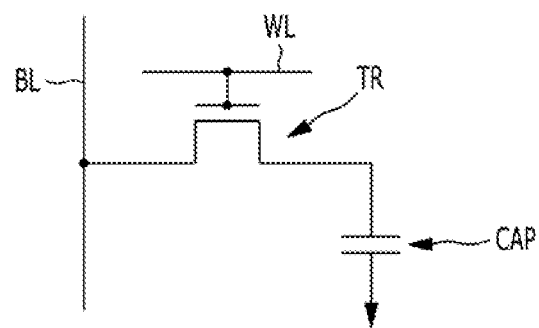
FIG. 11 is a circuit diagram illustrating a Dynamic Random Access Memory (DRAM) cell in accordance with an embodiment of the present disclosure.
Figure 12:
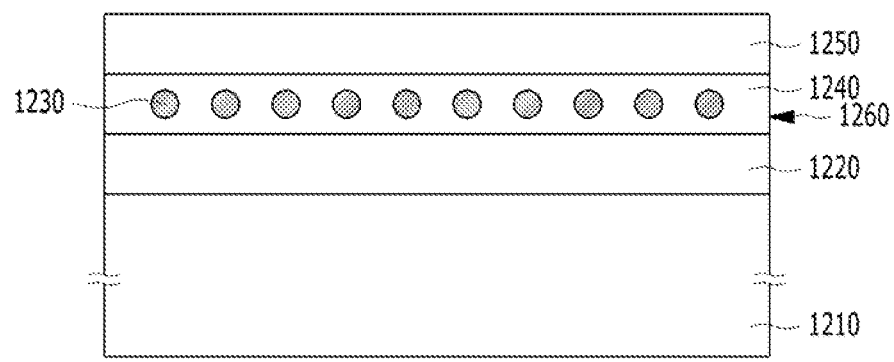
FIG. 12 is a cross-sectional view illustrating a DRAM cell capacitor in accordance with an embodiment of the present disclosure.

FIG. 11 is a circuit diagram illustrating a Dynamic Random Access Memory (DRAM) cell in accordance with an embodiment of the present disclosure. FIG. 12 is a cross-sectional view illustrating a DRAM cell capacitor in accordance with an embodiment of the present disclosure.

Referring to FIG. 11, the DRAM cell may include one transistor TR and one capacitor CAP. The PRAM cell may include the transistor TR having a gate coupled with a word line WL, and a drain or a source coupled with a bit line BL. Also, the DRAM cell may include the capacitor CAP that is coupled between a source or the drain of the transistor TR and a ground or a plate voltage. The transistor TR and the capacitor CAP may include the nano structures in accordance with the diverse embodiments of the present disclosure, which are described above. In another embodiment, only one between the transistor TR and the capacitor CAP may include the nano structures.

The transistor TR of the DRAM cell may be formed the same as the transistor or the single electron transistor that is described before with reference to FIGS. 7A and 7B. The nano structures may be applied to a channel region of the transistor TR.

The capacitor CAP, as described above with reference to FIG. 12, may include a first electrode 1220 formed over a substrate 1200, nano structures 1260 formed over the first electrode 1220, and a second electrode 1250 formed over the nano structures 1260. A typical capacitor has a dielectric substance between a first electrode and a second electrode.

However, the capacitor CAP in accordance with the embodiment of the present disclosure has a structure in which the nano structures 1260 including metallic nano particles 1230 and a dielectric substance 1240 surrounding the metallic nano particles 1230 are formed between the first electrode 1220 and the second electrode 1250. The capacitor CAP in accordance with the embodiment of the present disclosure has a greater capacitance due to the metallic nano particles 1230.

The nano structures 1260 of the capacitor CAP may have the same structure as the nano structures fabricated in accordance with the embodiments of the present disclosure described above. Also, the nano structures 1260 of the capacitor CAP may foe fabricated in the same method described above. The capacitor CAP in accordance with the embodiment of the present disclosure may be applied not only to the DRAM cell but also to other devices.

Figure 13:
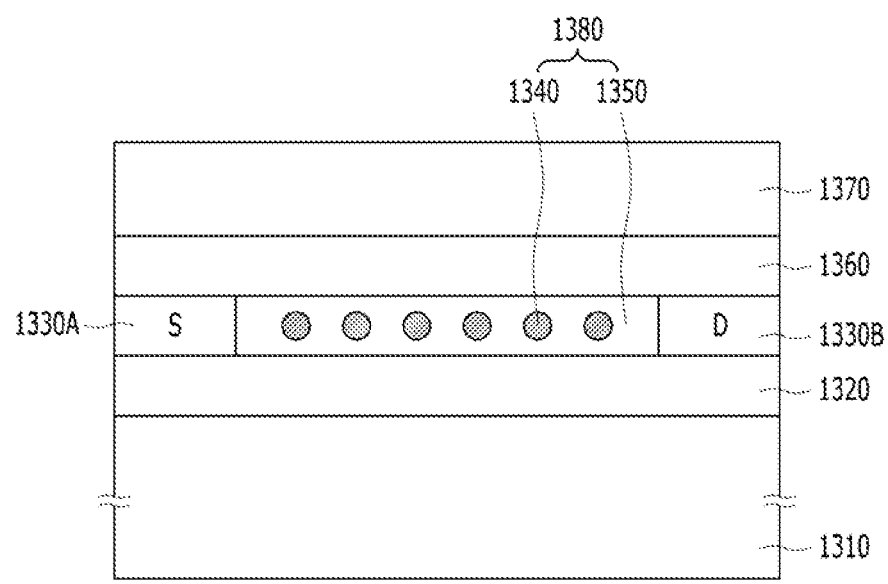
FIG. 13 is a cross-sectional view illustrating a memory device, which includes a capacitor-less DRAM cell, in accordance with another embodiment of the present disclosure.

FIG. 13 is a cross-sectional view illustrating a semiconductor memory device, which is a capacitorless DRAM cell, in accordance with another embodiment of the present disclosure.

Referring to FIG. 13, a tunnel insulation layer 1320 may be formed over a semiconductor substrate 1310. A floating body 1380 such as a silicon oxide layer may be formed over the tunnel insulation layer 1320. The floating body 1380 includes nano particles 1340. The floating body 1380 may also include a dielectric material 1350 that surrounds the nano- particles 1340. A source region 1330A and a drain region 1330B may be formed on the sides of the floating body 1380. A gate dielectric layer 1360 may be formed over the floating body 1380. A gate electrode 1370 may be formed over the gate dielectric layer 1360.

In the capacitorless DRAM cell, data are stored in the floating body 1380, not requiring any capacitor. Therefore, as the cell region is reduced, the integration degree of the DRAM cell may be improved.

The floating body 1380 of the capacitorless DRAM cell may have the same structure as the nano structures in accordance with the diverse embodiments of the present disclosure, which is described above, and it may be fabricated using the same method described above.

The embodiments of the present disclosure provide nano structures, a device using the nano structures, and a method for fabricating the nano structures. According to the embodiments of the present disclosure, nano particles are prepared upon applying a polymer including nano particle precursor metal atoms to a substrate.

In terms of thermodynamics, nano particles that are synthesized in the exterior inevitably have a variation in particle size. Nano particles synthesis technology has made great progress and it is becoming possible to synthesize extremely fine nano particles formed of tens to hundreds of atoms. The size difference between the nano particles becomes greater as the reaction field during the synthesis grows bigger. Therefore, the existing known technology of attaching externally pre-formed nano particles, which are not formed over a substrate but in the outside of the substrate, onto a substrate has limitations in the preparation of uniform nano particles. Also, a method of preparing nano particles in a top-down method through an etch process has limitations in mass-production for commercial purpose, even though lithography technology is highly advanced and it is possible to prepare particles of about 5 nm or smaller. This is because the method is high-cost, complicated and requires precise control.

Since the nano particles are directly prepared in a small reaction field that corresponds to a surface area of the substrate, the nano particles may be formed with a size that is extremely uniform and delicately controlled in high density. Since the nano particles are formed by applying energy to metal atoms after the metal atoms are fixed onto the substrate through a process of coating the substrate with the polymer including the metal atoms, it is simple, easy and capable of mass-producing the nano particles at a low cost within a short production time. Since the nucleation and growth are carried out by applying energy while the metal atoms are fixed onto the substrate, the migration of the metal atoms are overall uniformly suppressed, which leads to formation of uniform and fine nano particles. Furthermore, only metal atoms bonded with an organic material may participate in the nucleation and growth for forming nano particles. That is, the material for forming nano particles may be supplied only by the metal atoms bonded with the organic material. Since the metal atoms bonded with the organic material hardly migrate beyond a predetermined distance, the reaction field of each nano particle is limited to a near surrounding area of each nucleus. Therefore, nano particles having uniform and fine particle size may be formed over the substrate in a high density at a uniform interval. The space between the metallic nano particles may correspond to the diffusion distance of the metal atoms that contribute to the nucleation and growth of the nano particles.

The embodiments of the present disclosure provide nano structures, a device using the nano structures, and a method for fabricating the nano structures. According to the embodiments of the present disclosure, the nano structures may be prepared upon application of energy and requires no additional complicated process. Also, patterned nano particles may be prepared by attaching metal atoms through a direct coating process for coating a substrate, such as a patterned silicon substrate, a flexible polymer film, a transparent glass and the like, with a polymer including metal atoms and reducing and growing the metal atoms. As a result, it is possible to reduce production cost and achieve mass-production with a short production time.

Although various embodiments have been described for illustrative purposes, it will be apparent to those skilled in the art that various changes and modifications may be made without departing from the spirit and scope of the disclosure as defined in the following claims.

What is claimed is:

1. A method for fabricating nano structures, comprising:
    preparing a polymer solution including metal atoms, wherein the metal atoms are part of the polymer;
    applying the polymer solution to a substrate to attach the metal atoms onto the substrate; and
    aggregating the metal atoms into form metallic nano particles.

2. The method of claim 1, wherein the preparing of the polymer solution includes:
    mixing a metal precursor and an organic material in a solvent.

3. The method of claim 2,
    wherein sizes of the metallic nano particles are controlled by controlling a mixing rat so of the metal precursor and the organic material.

4. The method of claim 2,
    wherein the metallic nano particles collectively form a nano particle layer.

5. The method of claim 4,
    wherein the nano particle layer is a one-nanoparticle-thick layer, wherein the metallic nano particles are arranged in two dimensions along horizontal and vertical directions, and wherein the metallic nano particles are spaced apart from each other in the horizontal and the vertical directions.

6. The method of claim 4, wherein the nano particle layer is a multi-nanoparticle-thick layer, and wherein the metallic nano particles are arranged in three dimensions and spaced apart from each other in each of the three dimensions.

7. The method of claim 4, further comprising:

forming a one-nanoparticle-thick layer or a multi-nanoparticle-thick layer by controlling a mixing ratio of the metal precursor and the organic material.

8. The method of claim 2, wherein the substrate includes a hydrophilic surface layer, and wherein the polymer solution is hydrophilic.

9. The method of claim 2, wherein the substrate includes a hydrophobic surface layer, and wherein the polymer solution is hydrophobic.

10. The method of claim 1, wherein the polymer solution is applied to the substrate through a spin-coating process, and wherein the sizes of the metallic nano particles are controlled by controlling a spinning rate and time of the spin-coating process.

11. The method of claim 1, wherein the metallic nano particles are formed by reduction and growth of the metal atoms.

12. The method of claim 1, further comprising:

forming a protective layer after the forming of the metallic nano particles so that the metallic nano particles are buried in the protective layer, wherein the polymer solution includes a polymer and a solvent, wherein the polymer include an organic chain and the metal atoms, wherein the organic chain is bonded to the metal atoms, and wherein the metallic nano particles are attached to the substrate by the organic material chains.

13. The method of claim 12, further comprising:

removing an organic material, which does not contribute to bond the metal atoms to the substrate, before the protective layer is formed.

14. A method for fabricating nano structures, comprising:

forming a first polymer solution and a second polymer solution, wherein the first polymer solution includes first metal atoms, wherein the second polymer solution includes second metal atoms;

applying the first polymer solution to the substrate;

making a plurality of first metallic nano particles out of the first metal atoms in the first polymer solution, wherein the plurality of first metallic nano particles collectively form a first nano particle layer;

applying the second polymer solution to the first nano particle layer; and making a plurality of second metallic nano particles out of the second metal atoms in the second polymer solution, wherein the plurality of second metallic nano particles collectively form a second nano particle layer.

15. The method of claim 14, wherein an average particle diameter of the first metallic nano particles is different from an average particle diameter of the second metallic nano particles.

16. The method of claim 15, wherein the average particle diameters of the first metallic nano particles and the second metallic nano particles are controlled by differentiating concentrations of the first and the second metal atoms included in the first polymer solution and the second polymer solution, respectively.

17. The method of claim 14, wherein the first metallic nano particles and the second metallic nano particles are formed of different materials from each other.

18. The method of claim 14, wherein each of the first polymer solution and the second polymer solution is applied through a spin-coating process, wherein each of the first metallic nano particles and the second metallic nano particles is a one-nanoparticle-thick layer or a multi-nanoparticle-thick layer, and wherein each of the thicknesses of the first metallic nano particles and the second metallic nano particles is adjusted by controlling a spinning rate and time of the spin-coating process.

19. The method of claim 14, wherein the first metallic nano particles and the second metallic nano particles are formed by reduction and growth of the first and the second metal atoms, respectively.

20. The method of claim 14, wherein the substrate includes guide grooves for arrangement of the first metallic nano particles on a surface of the substrate.

* * * * *